(12) United States Patent
Ishito (10) Patent No.: US 10,642,151 B2
(45) Date of Patent: May 5, 2020

(54) PELLICLE SUPPORT FRAME AND PRODUCTION METHOD

(71) Applicant: NIPPON LIGHT METAL COMPANY, LTD., Tokyo (JP)

(72) Inventor: Nobuyuki Ishito, Shizuoka (JP)

(73) Assignee: NIPPON LIGHT METAL COMPANY, LTD., Tokyo (JP)

( * ) Notice: Subject to any disclaimer, the term of this patent is extended or adjusted under 35 U.S.C. 154(b) by 0 days.

(21) Appl. No.: 15/524,234

(22) PCT Filed: Sep. 9, 2015

(86) PCT No.: PCT/JP2015/075550
§ 371 (c)(1),
(2) Date: May 3, 2017

(87) PCT Pub. No.: WO2016/072149
PCT Pub. Date: May 12, 2016

(65) Prior Publication Data
US 2017/0343894 A1    Nov. 30, 2017

(30) Foreign Application Priority Data
Nov. 4, 2014   (JP) ................................ 2014-224521

(51) Int. Cl.
*G03F 1/62* (2012.01)
*G03F 1/64* (2012.01)
(Continued)

(52) U.S. Cl.
CPC ................ *G03F 1/64* (2013.01); *B23K 20/00* (2013.01); *C25D 11/04* (2013.01); *G03F 1/14* (2013.01); *G03F 1/142* (2013.01); *G03F 1/62* (2013.01)

(58) Field of Classification Search
CPC ... G03F 1/14; G03F 1/142; G03F 1/62; G03F 1/64; B23K 20/00; C25D 11/04
See application file for complete search history.

(56) References Cited

U.S. PATENT DOCUMENTS 4,890,784 A *  1/1990  Bampton ............. B23K 35/002
                                                           228/194
6,459,090 B1 * 10/2002  Suzuki ...................... G03F 1/20
                                                         250/492.23
(Continued)

FOREIGN PATENT DOCUMENTS

EP         1898261 A1      3/2008
JP       61-145936 U  *   9/1986
(Continued)

OTHER PUBLICATIONS

Machine translation of JP 2004-354720 (2004).*
(Continued)

*Primary Examiner* — Martin J Angebrannt
(74) *Attorney, Agent, or Firm* — Merchant & Gould P.C.

(57) ABSTRACT

A pellicle support frame is provided with a frame body made of aluminum alloy and has a pellicle film bonded to the upper surface of the frame body and a transparent substrate bonded to the lower surface of the frame body. Within the frame body, a plurality of hollow portions are provided to be lined up in the circumferential direction of the frame body, and a through-hole which leads from the outer peripheral surface to the inner peripheral surface of the frame body is formed between two adjacent hollow portions. This configuration makes it possible to prevent strain from arising in the support frame and the transparent substrate after the support frame is bonded to the transparent substrate.

11 Claims, 7 Drawing Sheets

(51) Int. Cl.
  *B23K 20/00* (2006.01)
  *C25D 11/04* (2006.01)
  *G03F 1/00* (2012.01)

(56) References Cited

U.S. PATENT DOCUMENTS

| | | | | |
|---|---|---|---|---|
| 7,550,723 | B2 * | 6/2009 | Kaito | B82Y 35/00 |
| | | | | 250/304 |
| 8,663,756 | B2 * | 3/2014 | Hamada | G03F 1/64 |
| | | | | 428/14 |
| 9,841,670 | B2 * | 12/2017 | Kohmura | G03F 1/64 |
| 2001/0009334 | A1 | 7/2001 | Kawasaki et al. | |
| 2008/0063952 | A1 | 3/2008 | Shirasaki | |
| 2009/0191470 | A1 | 7/2009 | Shirasaki | |
| 2009/0246644 | A1 * | 10/2009 | Chakravorty | G03F 1/64 |
| | | | | 430/5 |
| 2010/0323302 | A1 | 12/2010 | Hanazaki et al. | |
| 2014/0106265 | A1 | 4/2014 | Sekihara | |
| 2014/0307237 | A1 * | 10/2014 | Sekihara | C23C 4/08 |
| | | | | 355/30 |

FOREIGN PATENT DOCUMENTS

| | | | | |
|---|---|---|---|---|
| JP | H3-43652 U | | 4/1991 | |
| JP | 04-093945 | * | 3/1992 | ............... G03F 1/14 |
| JP | 04-163551 | * | 6/1992 | ............... G03F 1/14 |
| JP | H05-107747 A | | 4/1993 | |
| JP | 06-015353 | * | 1/1994 | ............ B21C 37/15 |
| JP | H9-68793 A | | 3/1997 | |
| JP | 11-202476 | * | 7/1999 | ............... G03F 1/14 |
| JP | 2002-202589 A | | 7/2002 | |
| JP | 2003-107678 A | | 4/2003 | |
| JP | 2004-240221 A | | 8/2004 | |
| JP | 2004-354720 | * | 12/2004 | ............... G03F 1/14 |
| JP | 2006-091667 | * | 4/2006 | ............... G03F 1/14 |
| JP | 2006-184817 A | | 7/2006 | |
| JP | 2009-25562 A | | 2/2009 | |
| JP | 2013-222143 A | | 10/2013 | |
| JP | 2014-81454 A | | 5/2014 | |
| KR | 2007-087967 | * | 8/2007 | .......... H01L 21/027 |
| TW | 201313578 A | | 4/2013 | |
| TW | 201323315 A | | 6/2013 | |

OTHER PUBLICATIONS

International Search Report for PCT/JP2015/075550, dated Dec. 1, 2015.

Office Action for Taiwanese Patent Application No. 104132795, dated Oct. 3, 2018.

Search Report for European Patent Application No. 15856945.9, dated Jun. 20, 2018.

* cited by examiner

FIG.1

PELLICLE SUPPORT FRAME AND PRODUCTION METHOD

CROSS-REFERENCE TO RELATED APPLICATION

This application is a U.S. National Stage Application under 35 U.S.C. § 371 of International Patent Application No. PCT/JP2015/075550 filed Sep. 9, 2015, which claims the benefit of priority to Japanese Patent Application No. 2014-224521 filed Nov. 4, 2014, the disclosures of all of which are hereby incorporated by reference in their entireties.

TECHNICAL FIELD

The present invention relates to a pellicle support frame and a production method therefor.

BACKGROUND

Processes for manufacturing integrated circuits include a photolithographic process for transferring a circuit pattern drawn on a transparent substrate called a photomask or a reticle, onto a resist coated on a wafer.

When foreign substances such as dust adhere to the transparent substrate in the photolithographic process described above, the circuit pattern to be transferred onto the resist blurs. To cope with this, a dust-proof cover called a pellicle is covered on the transparent substrate (see, for example, Patent Literature 1 or Patent Literature 2).

The pellicle is provided with a support frame that surrounds the entirety of the circuit pattern drawn on the transparent substrate, and a light transmissive pellicle film that is provided to cover an upper surface of the support frame. A lower surface of the support frame is bonded to the transparent substrate.

CITATION LIST

Patent Literature

Patent Literature 1: Japanese Unexamined Patent Application Publication No. 2009-025562
Patent Literature 2: Japanese Unexamined Patent Application Publication No. H09-068793

SUMMARY OF THE INVENTION

Technical Problem

The support frame described above may strain in the state of a single body in the upper-lower direction, but when bonded to a flat transparent substrate, the support frame is bonded in a flat state to the transparent substrate because it is pressed against the transparent substrate. However, resilience that functions to return the support frame to its former strained shape is generated in the support frame, thus allowing strain that follows deformation of the support frame to arise in the transparent substrate when the resilience is great.

Moreover, the strain arising in the transparent substrate causes a problem that when the circuit pattern on the transparent substrate is transferred onto the resist on the wafer, the circuit pattern is deviated from the regular location.

The present invention has been made to solve the above problem and an object of the invention is to provide a pellicle support frame and a production method for the pellicle support frame that are capable of preventing strain from arising in the support frame and a transparent substrate after the support frame is bonded to the transparent substrate.

Solution to Problem

In order to solve the above problem, the present invention provides, as one aspect thereof, a pellicle support frame including: a frame body made of aluminum alloy; a pellicle film bonded to an upper surface of the frame body; a transparent substrate bonded to a lower surface of the frame body; a plurality of hollow portions that are provided within the frame body to be lined up in a circumferential direction of the frame body; and a through-hole that is formed between two adjacent hollow portions of the plurality of hollow portions, the through-hole leading from an outer peripheral surface to an inner peripheral surface of the frame body.

The hollow portions formed in the support frame allow rigidity of the support frame to be decreased. This allows resilience to become small, the resilience functioning to return the support frame to its former strained shape after the support frame is bonded to a flat transparent substrate, thus making it possible to keep the support frame in a flat shape that follows the transparent substrate.

Also, in the present invention, the hollow portions in the support frame are not communicated with an external space, thus making it possible to prevent foreign substances such as dust or treatment liquid during processing, from entering the hollow portions.

Moreover, the through-hole is formed in the frame body, thus making it possible to prevent a difference in pressure from being generated between the inner space and the external space of the support frame in a vacuum after the pellicle film and the transparent substrate are bonded to the support frame.

In the pellicle support frame described above, two frame members may be bonded together to form the frame body. In this case, a plurality of grooves may be provided to be lined up in the circumferential direction on at least one of bonding surfaces of both of the frame members to allow the grooves to form the hollow portions. Formation in this way makes it possible to easily produce the support frame of hollow structure.

In order to solve the above problem, the present invention provides, as another aspect thereof, a production method for a pellicle support frame composed of two frame members made of aluminum alloy. The present method includes a step of forming a groove on at least one of bonding surfaces of both of the frame members, and a step of bonding the bonding surfaces of both of the frame members to each other to allow the groove to form a hollow portion.

In the production method for the pellicle support frame described above, when both of the frame members are subjected to solid-phase bonding, the two frame members can be bonded together with high accuracy and a decrease in strength of the support frame can be prevented.

Note that bonding methods such as diffusion bonding, vapor deposition using focused ion beam, and friction stir welding can be employed as the solid-phase bonding.

The hollow portion formed in the support frame by the production method described above allows rigidity of the support frame to be decreased. This allows resilience to become small, the resilience functioning to return the support frame to its former strained shape after the support frame is bonded to a flat transparent substrate, thus making it possible to keep the support frame in a flat shape that follows the transparent substrate.

Also, the support frame formed by the production method according to the present invention allows the hollow portion to be not communicated with the external space, thus making it possible to prevent foreign substances such as dust or treatment liquid during processing, from entering the hollow portion.

Moreover, the production method according to the present invention makes it possible to easily produce the support frame of hollow structure.

Advantageous Effects of the Invention

The pellicle support frame and the production method therefor according to the present invention make it possible to decrease rigidity of the support frame, thus allowing resilience to become small, the resilience functioning to return the support frame to its former strained shape after the support frame is bonded to a flat transparent substrate. That is, the present invention allows the support frame and the transparent substrate to be kept in a flat state, thus making it possible to transfer circuit patterns on the transparent substrate onto a resist on a wafer with high accuracy.

BRIEF DESCRIPTION OF DRAWINGS

FIGS. 5A and 5B are views showing two frame members according to the embodiment of the present invention, in which

FIGS. 7A and 7B are views showing support frames according to still another embodiment of the present invention, in which

DESCRIPTION OF EMBODIMENTS

Embodiments of the present invention will be described in detail with reference to the drawings as appropriate.

Note that each drawing in the present embodiment appropriately and schematically illustrates each part of a support frame for comprehensibly explaining a configuration of the support frame.

In the description below, the terms "front", "back", "left", "right", "upper" and "lower" are defined for comprehensibly explaining the support frame, and thus do not specify the configuration of the support frame.

Figure 1:
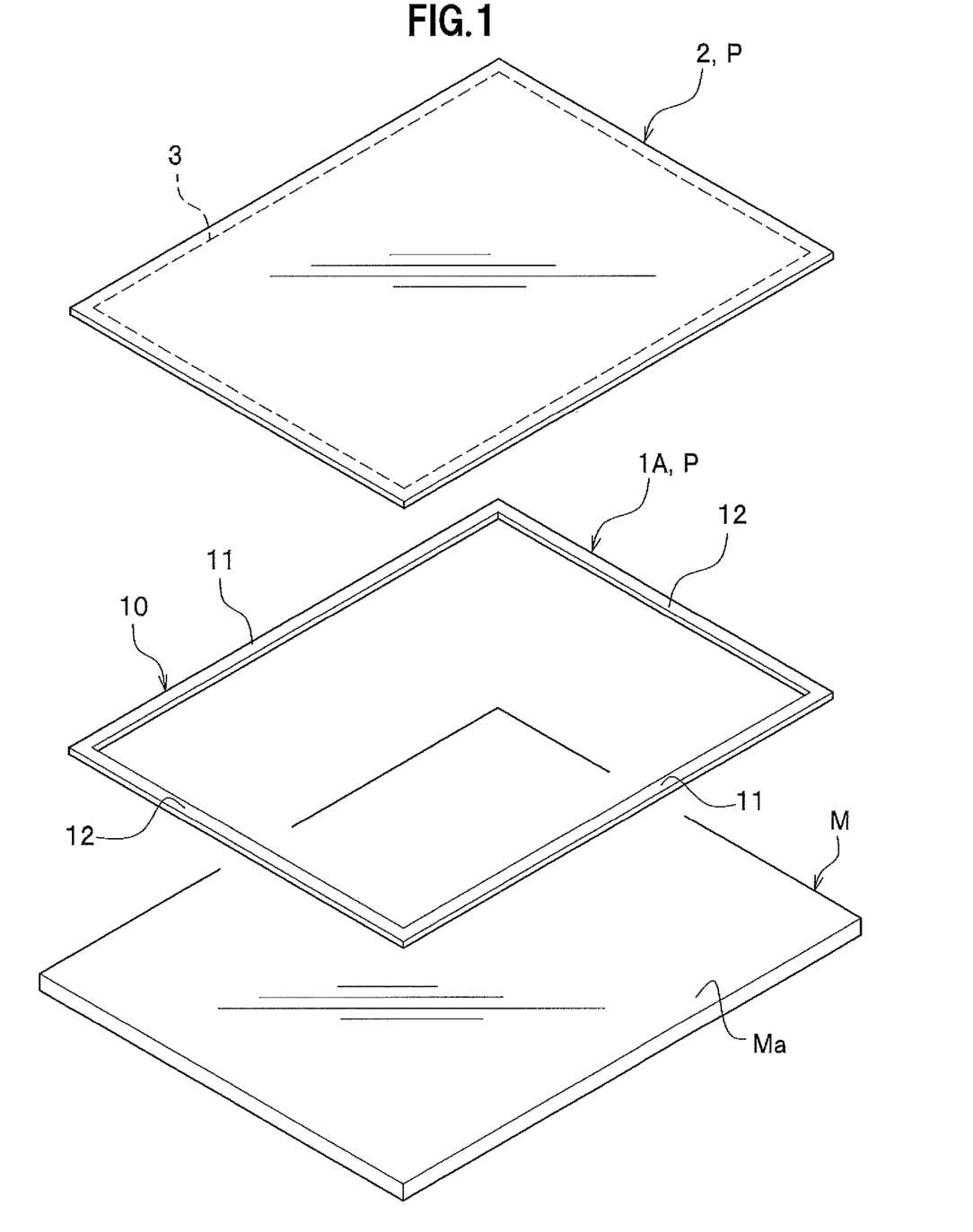
FIG. 1 is a perspective view showing a pellicle and a transparent substrate according to an embodiment of the present invention.

As shown in FIG. 1, a support frame 1A in the present embodiment is used in a pellicle P. The pellicle P is a dust-proof cover for preventing dust or the like from adhering to an upper surface Ma of a transparent substrate M (photomask).

The pellicle P is provided with the support frame 1A that surrounds the entirety of a circuit pattern (not shown) drawn on the transparent substrate M, and a pellicle film 2 that is provided to cover an upper surface of the support frame 1A.

The support frame 1A has a frame body 10 that has a rectangular shape in planar view. The frame body 10 is composed of a pair of crosswise frame portions 11, 11 at the front and back sides, and a pair of lengthwise frame portions 12, 12 at the right and left sides.

Both of the crosswise frame portions 11, 11 are each a portion that constitutes a long side of the frame body 10, and both of the lengthwise frame portions 12, 12 are each a portion that constitutes a short side of the frame body 10.

Figure 2:
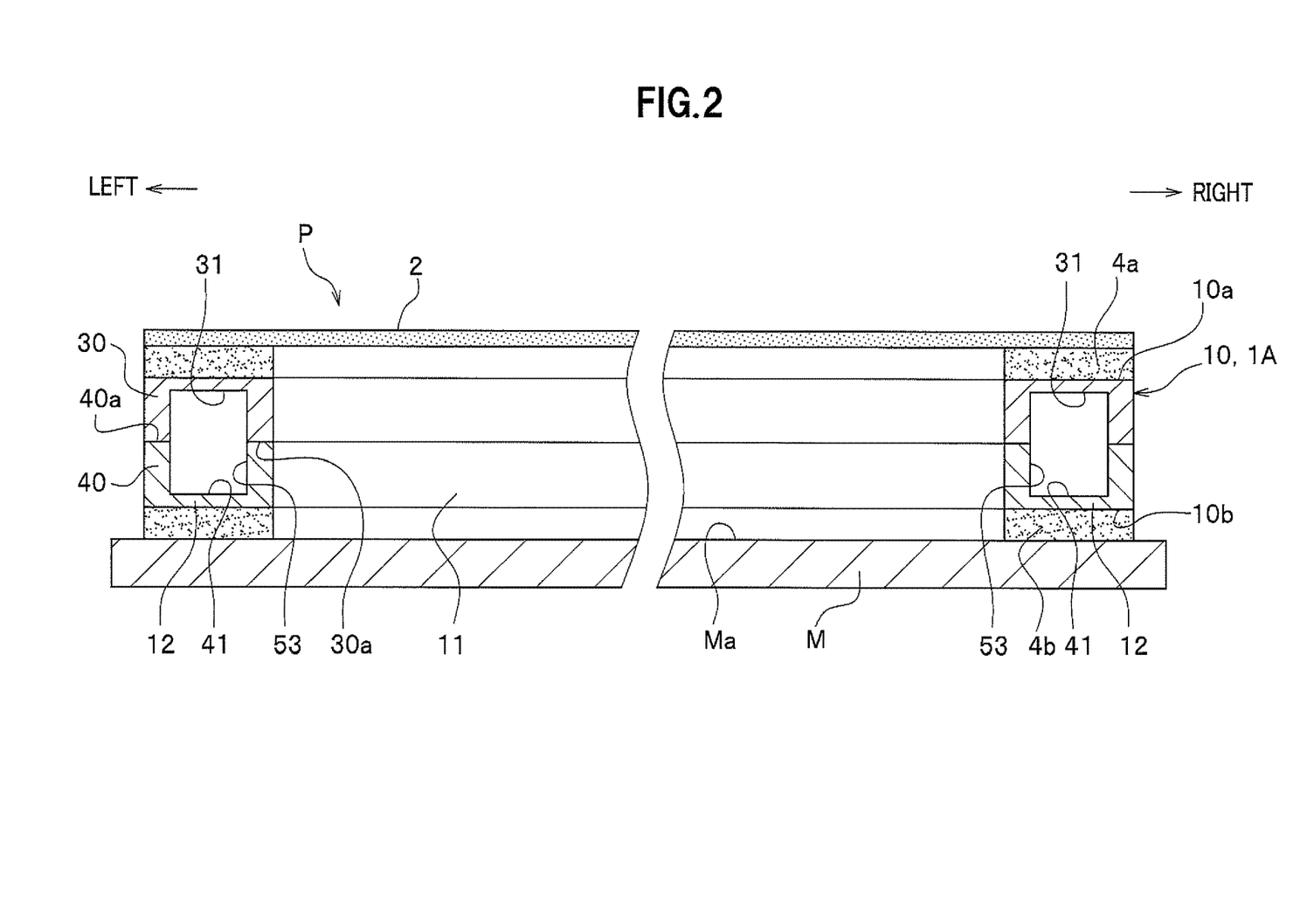
FIG. 2 is a sectional side view showing the pellicle and the transparent substrate according to the embodiment of the present invention.

As shown in FIG. 2, axial cross-sections of the crosswise frame portion 11 and the lengthwise frame portion 12 are each formed into a rectangular shape in which its height dimension is greater than its width dimension.

As shown in FIG. 1, the pellicle film 2 is a thin film having light transmission properties and is formed, for example, using cellulosic polymer such as nitrocellulose, cellulose acetate, and cellulose propionate, amorphous fluoric polymer or the like, which are good in ultraviolet light transmission properties.

The pellicle film 2 is formed in a rectangular shape in planar and has the same shape as the outer shape of the support frame 1A.

When the pellicle film 2 is overlapped with an upper surface 10a of the frame body 10, the entirety of the upper surface 10a of the frame body 10 is covered by the pellicle film 2.

The frame body 10 is a member formed of a frame member 30 at the upper side and a frame member 40 at the lower side, which are bonded together. Both of the frame members 30, 40 are obtained by machining extruded material made of aluminum alloy.

Both of the frame members 30, 40 are members having the same shape, and both of the frame members 30, 40 are oppositely disposed in the upper-lower direction. Moreover, a lower surface 30a of the frame member 30 at the upper side and an upper surface 40a of the frame member 40 at the lower side are bonded together.

Figure 3:
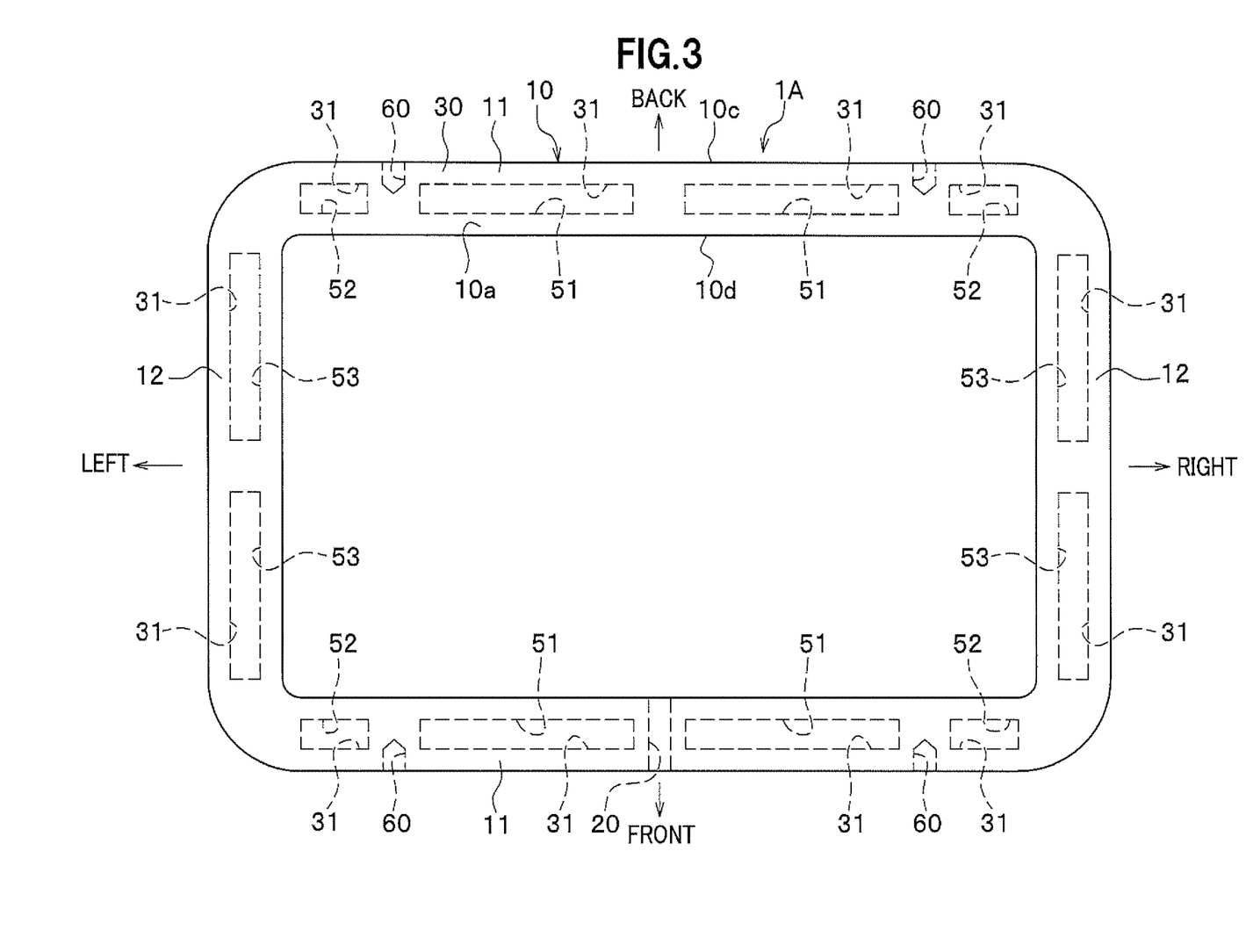
FIG. 3 is a schematic plan view showing a support frame according to the embodiment of the present invention.

As shown in FIG. 3, the frame body 10 has a through-hole 20, a plurality of hollow portions 51 to 53, and a plurality of holes 60 for jig formed therein.

Figure 4A:
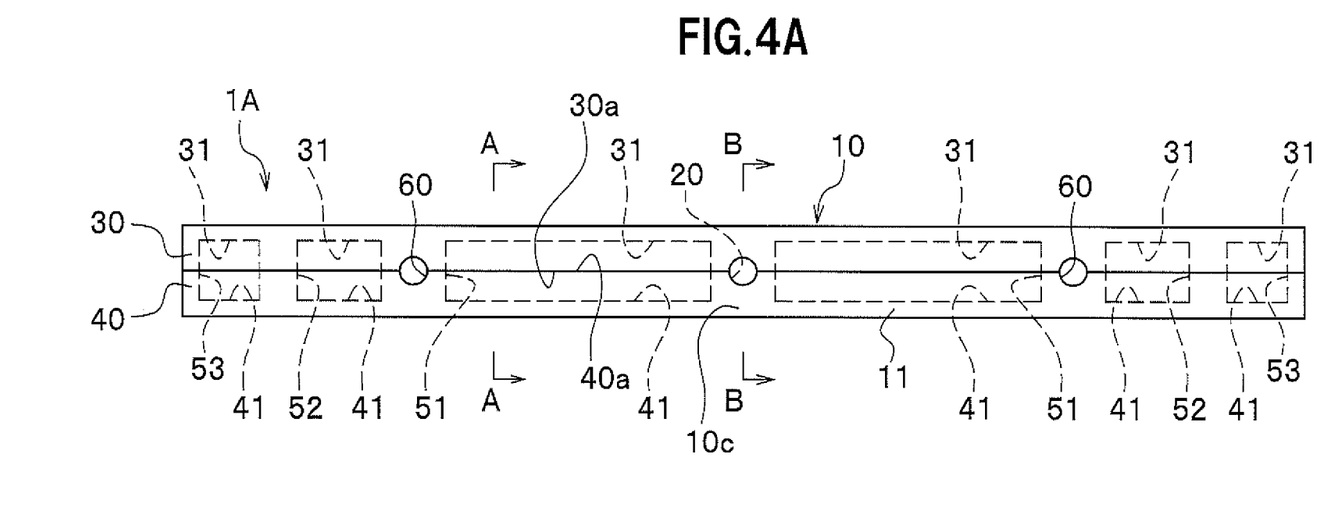
FIG. 4A is a schematic side view showing the support frame according to the embodiment of the present invention.
Figure 4B:
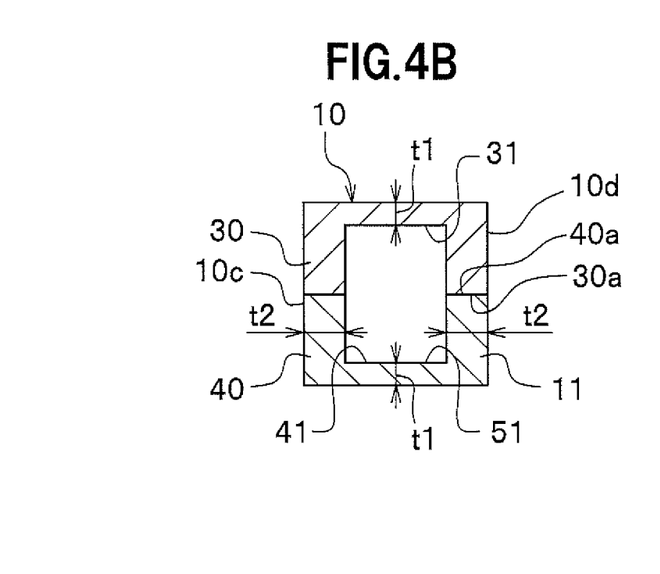
FIG. 4B is a sectional view taken along the A-A line.
Figure 4C:
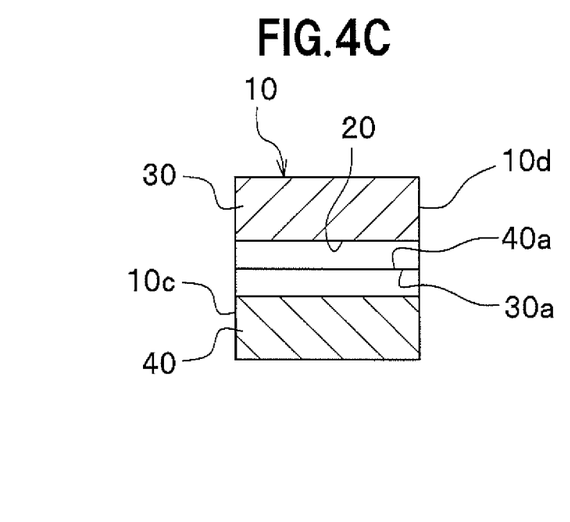
FIG. 4C is a sectional view taken along the B-B line.

As shown in FIG. 4C, the through-hole 20 is a cylindrical hole that penetrates from an outer peripheral surface 10c to an inner peripheral surface 10d of the frame body 10. The through-hole 20 is disposed in the center in the height direction of the frame body 10.

Note that, although the through-hole 20 is formed in the center in the right-left direction of the crosswise frame portion 11 at the front side in the present embodiment as shown in FIG. 3, location of the through-hole 20 is not limited to the embodiment. For example, the through-hole 20 may be formed in the crosswise frame portion 11 at the back side, or in the lengthwise frame portions 12, 12 at the right and left sides. Moreover, the number of the through-hole 20 is also not limited to the above embodiment. For example, the through-hole 20 may be formed in each of the crosswise frame portion 11 and the lengthwise frame portion 12, or the through-hole 20 may be formed in both of the crosswise frame portions 11, 11 at the front and back sides, or in both of the lengthwise frame portions 12, 12 at the right and left sides.

The holes 60 for jig are cylindrical bottomed holes that are formed on the outer peripheral surface 10c of the frame body 10. The holes 60 for jig are sections used for holding the support frame 1A by means of a jig at the time of manufacture of the support frame 1A and in use of the pellicle (see FIG. 1). The holes 60 for jig are adapted to allow pins of the jig to be inserted therein.

Note that, although the holes 60 for jig are disposed in the center in the height direction of the frame body 10 in the present embodiment as shown in FIG. 4A, a height of the holes 60 for jig is not limited to the embodiment. The height of the holes 60 for jig may be set depending on the jig to be employed.

As shown in FIG. 3, the holes 60 for jig are formed near the right-left both ends of the crosswise frame portion 11 at the front side and formed near the right-left both ends of the crosswise frame portion 11 at the back side. That is, the crosswise frame portions 11, 11 at the front and back sides of the frame body 10 have two right and left holes 60 for jig formed therein, respectively.

Within the frame body 10, twelve hollow portions 51 to 53 are provided to be lined up in the circumferential direction of the frame body 10. Each of the hollow portions 51 to 53 is an enclosed space whose axial cross-section is rectangular in shape (see FIG. 4B).

The crosswise frame portion 11 at the front side has two right and left first hollow portions 51, 51 and two right and left second hollow portions 52, 52 formed therein. The first hollow portions 51 and the second hollow portions 52 each extend linearly in the longer direction of the crosswise frame portion 11 (in the right-left direction in FIG. 3).

The right and left first hollow portions 51, 51 are disposed across the center in the longer direction of the crosswise frame portion 11 at the front side from each other.

As shown in FIG. 4B, an axial cross-section of the first hollow portion 51 is formed into a rectangular shape in which its height dimension is greater than its width dimension. The first hollow portion 51 is disposed in the center in the shorter direction of the crosswise frame portion 11 (in the front-back direction in FIG. 3) and in the center in the upper-lower direction of the crosswise frame portion 11.

Note that a section surrounding the first hollow portion 51 in the crosswise frame portion 11 is formed to allow a thickness t2 of the left wall portion and the right wall portion to be greater than a thickness t1 of the upper portion and the lower portion.

A half at the upper side of the first hollow portion 51 is formed of a groove 31 that is formed on the lower surface 30a of the frame member 30 at the upper side. Also, a half at the lower side of the first hollow portion 51 is formed of a groove 41 that is formed on the upper surface 40a of the frame member 40 at the lower side. Thus, the grooves 31, 41 formed on bonding surfaces of both of the frame members 30, 40 are aligned with each other to form the first hollow portion 51.

As shown in FIG. 3, the right and left second hollow portions 52, 52 are disposed on the right-left both sides across the two first hollow portions 51, 51 from each other. Both of the second hollow portions 52, 52 are disposed at the both ends in the longer direction of the crosswise frame portion 11. The second hollow portion 52 is formed to allow a length in the longer direction thereof to be shorter than a length in the longer direction of first hollow portion 51.

The hole 60 for jig is disposed between the first hollow portion 51 and the second hollow portion 52 that lie next to each other (see FIG. 4A).

An axial cross-section of the second hollow portion 52 has the same shape as the axial cross-section (see FIG. 4B) of the first hollow portion 51. Moreover, as shown in FIG. 4A, the second hollow portion 52 is formed of the grooves 31, 41 formed on the bonding surfaces of the frame members 30, 40 at the upper and lower sides, in the same manner as the first hollow portion 51.

As shown in FIG. 3, the crosswise frame portion 11 at the back side has two right and left first hollow portions 51, 51 and two right and left second hollow portions 52, 52 formed therein, in the same manner as the crosswise frame portion 11 at the front side.

Moreover, the crosswise frame portion 11 at the back side has the holes 60 for jig each disposed between the first hollow portion 51 and the second hollow portion 52 that lie next to each other.

The lengthwise frame portion 12 at the left side has two front and back third hollow portions 53, 53 formed therein. The third hollow portions 53 extend linearly in the longer direction of the lengthwise frame portion 12 (in the front-back direction in FIG. 3).

The front and back third hollow portions 53, 53 are disposed across the center in the longer direction of the lengthwise frame portion 12 at the left side from each other.

An axial cross-section of the third hollow portion 53 has the same shape as the axial cross-section (see FIG. 4B) of the first hollow portion 51. Moreover, as shown in FIG. 4A, the third hollow portion 53 is formed of the grooves 31, 41 formed on the bonding surfaces of the frame members 30, 40 at the upper and lower sides, in the same manner as the first hollow portion 51.

As shown in FIG. 3, the lengthwise frame portion 12 at the right side has two front and back third hollow portions 53, 53 formed therein, in the same manner as the lengthwise frame portion 12 at the left side.

Next, description will be given of a production method for the support frame 1A described above.

Figure 5A:
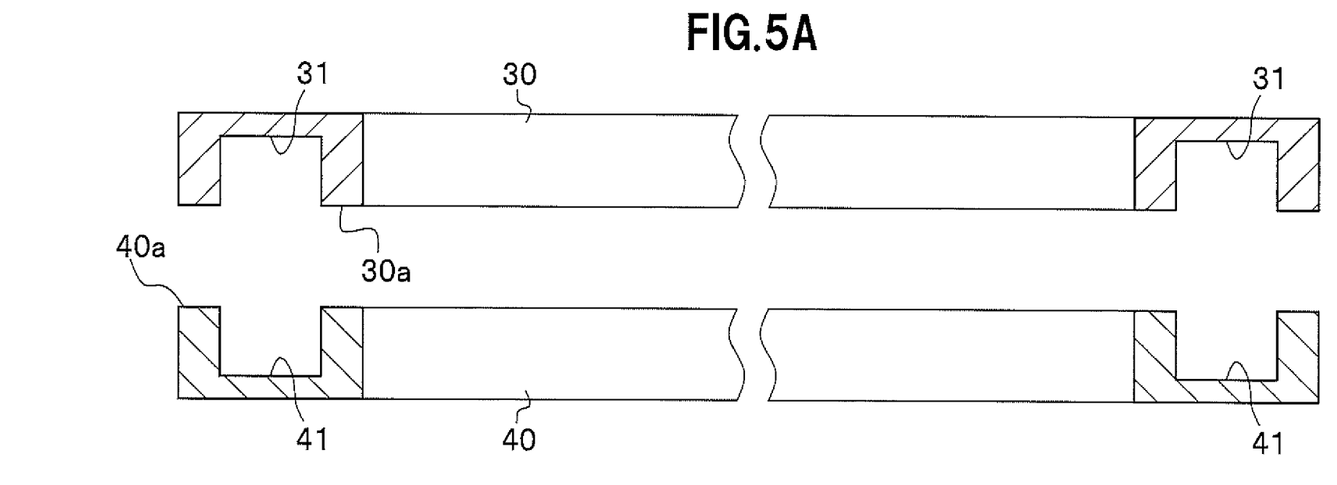
FIG. 5A is a sectional side view of a state before the two frame members are bonded together.

First, an extruded material having the form of a square tube and made of aluminum alloy is cut in a direction perpendicular to the axial direction thereof to prepare two frame members 30, 40 as shown in FIG. 5A.

Subsequently, the groove 31 is formed on the lower surface 30a of the frame member 30 at the upper side and the groove 41 is formed on the upper surface 40a of the frame member 40 at the lower side.

Figure 5B:
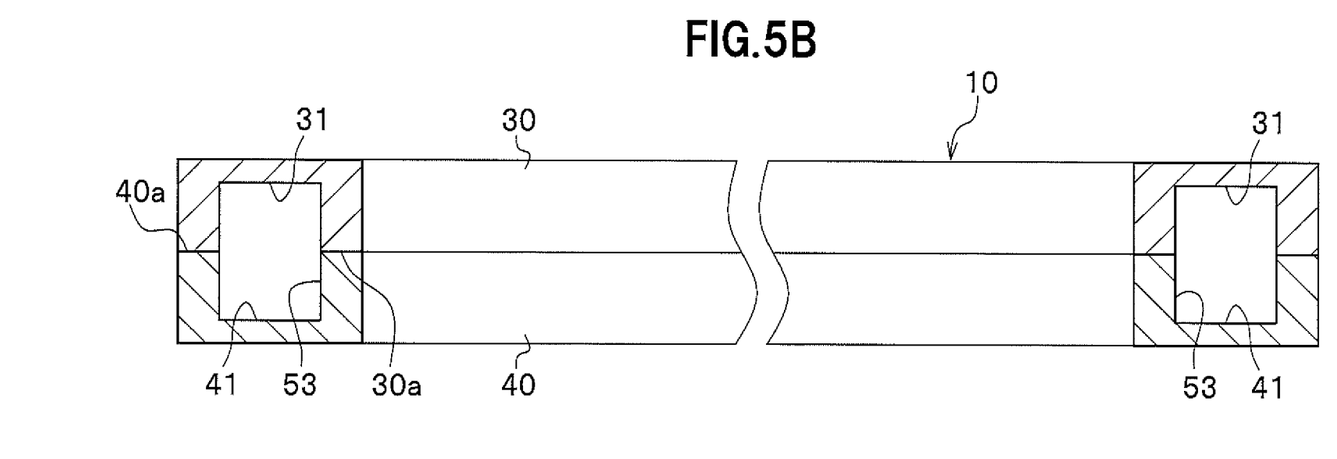
FIG. 5B is a sectional side view of a state of the two frame members being bonded together.

As shown in FIG. 5B, the frame member 30 at the upper side and the frame member 40 at the lower side are overlapped each other in the upper-lower direction. More specifically, both of the frame members 30, 40 are overlapped each other so that the groove 31 of the frame member 30 at the upper side and the groove 41 of the frame member 40 at the lower side face each other.

Then, the lower surface 30a of the frame member 30 at the upper side and the upper surface 40a of the frame member 40 at the lower side are bonded together. This allows the frame body 10 composed of the two frame members 30, 40 to be formed.

In the present embodiment, the bonding surfaces of both of the frame members 30, 40 are subjected to solid-phase bonding. Bonding methods such as diffusion bonding, vapor deposition using focused ion beam, and friction stir welding can be employed as the solid-phase bonding.

Bonding both of the frame members 30, 40 together allows the grooves 31, 41 of both of the frame members 30, 40 to be overlapped each other to form each of the hollow portions 51 to 53 (see FIG. 3) from the grooves 31, 41 at the upper and lower sides.

Subsequently, as shown in FIG. 3, the through-hole 20 is formed between the first hollow portions 51, 51 that lie next to each other in the crosswise frame portion 11 at the front side.

Moreover, the holes 60 for jig are each formed between the first hollow portion 51 and the second hollow portion 52 that lie next to each other in the crosswise frame portions 11, 11 at the front and back sides.

This allows, as shown in FIG. 4A, the support frame 1A to be formed which is provided with the frame body 10 composed of the two frame members 30, 40 at the upper and lower sides.

Note that, prior to bonding both of the frame members 30, 40 together, the through-hole 20 and the holes 60 for jig may be formed on the bonding surfaces of both of the frame members 30, 40.

Next, when bonding the pellicle film 2 and the transparent substrate M to the support frame 1A as shown in FIG. 2, adhesive such as acrylic resin or epoxy resin is first coated on the upper surface 10a of the frame body 10 to form an adhesive layer 4a on the upper surface 10a of the frame body 10.

Then, the pellicle film 2 is overlapped with the adhesive layer 4a at the upper side, thereby allowing the pellicle film 2 to be bonded via the adhesive layer 4a to the upper surface 10a of the frame body 10.

Subsequently, a pressure-sensitive adhesive layer 4b such as polybutene resin, polyvinyl acetate resin or acrylic resin is formed on the lower surface 10b of the frame body 10.

Then, the upper surface Ma of the transparent substrate M is overlapped with the pressure-sensitive adhesive layer 4b at the lower side and the support frame 1A is pressed against the transparent substrate M, thereby allowing the support frame 1A to be bonded via the pressure-sensitive adhesive layer 4b to the upper surface Ma of the transparent substrate M.

In the support frame 1A described above, the plurality of hollow portions 51 to 53 are formed in the frame body 10 as shown in FIG. 3. Forming the support frame 1A into a hollow structure in this way allows second moment of area of the frame body 10 to become small and thus allows rigidity of the support frame 1A to be decreased.

This allows resilience to become small, the resilience functioning to return the support frame 1A to its former strained shape after the support frame 1A is bonded to the flat transparent substrate M shown in FIG. 2, thus making it possible to keep the support frame 1A in a flat shape that follows the transparent substrate M.

The support frame 1A and the transparent substrate M can be kept in the flat state in this way, thus making it possible to transfer circuit patterns on the transparent substrate M onto a resist on a wafer with high accuracy.

Also, as shown in FIG. 3, the hollow portions 51 to 53 in the support frame 1A are not communicated with an external space, thus making it possible to prevent foreign substances such as dust or treatment liquid during processing, from entering the hollow portions 51 to 53.

Moreover, the through-hole 20 is formed in the frame body 10 in the support frame 1A, thus making it possible to prevent a difference in pressure from being generated between the inner space and the external space of the support frame 1A in a vacuum after the pellicle film 2 and the transparent substrate M (see FIG. 2) are bonded to the support frame 1A.

The production method according to the present embodiment allows the bonding surfaces of the two frame members 30, 40 to be bonded together as shown in FIG. 4A, thereby making it possible to easily produce the support frame 1A of hollow structure described above. Also, both of the frame members 30, 40 are subjected to solid-phase bonding, thereby making it possible to bond both of the frame members 30, 40 each other with high accuracy and to prevent a decrease in strength of the support frame 1A.

Although the embodiment of the present invention has been described above, the present invention is limited to the above embodiment and can be appropriately modified within the scope not departing from the gist thereof.

Figure 6:
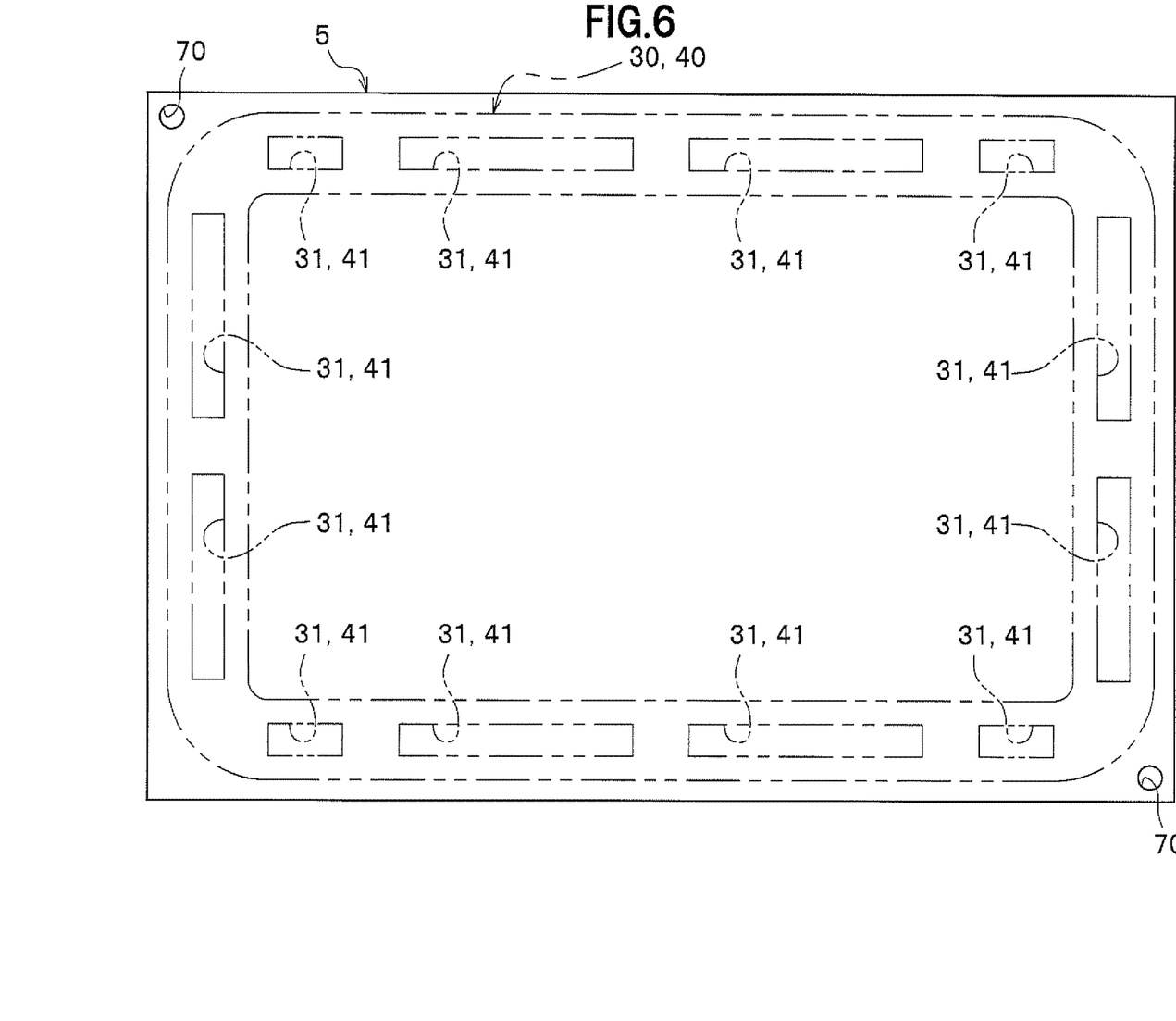
FIG. 6 is a plan view showing a flat plate that is used in a production method according to another embodiment of the present invention.

Although the frame member 30, 40 (see FIG. 5A) is cut out from the extruded material having the form of a square tube in the above embodiment, for example, as shown in FIG. 6, the frame member 30, 40 may be formed of a flat plate 5 made of aluminum alloy.

This configuration is obtained by hollowing two flat plates 5, 5 to form the two frame members 30, 40, forming the grooves 31, 41 on both of the frame members 30, 40, and bonding both of the frame members 30, 40 together.

The flat plate 5 shown in FIG. 6 has positioning holes 70, 70 formed at a pair of corners on a diagonal line thereof. When the two frame members 30, 40 are bonded together, the positioning holes 70 of both of the frame members 30, 40 are aligned with each other, thereby making it possible to bond both of the frame members 30, 40 together with high accuracy. Note that the positioning holes 70 are formed on a region which is to be cut off when the peripheral part of the frame body 10 is subjected to cutting work.

Although the two frame members 30, 40 are subjected to solid-phase bonding in the present embodiment as shown in FIG. 5A, the bonding method is not limited to the embodiment. For example, both of the frame members 30, 40 may be bonded together by means of welding such as arc welding and resistance welding.

Although the two frame members 30, 40 are bonded together to form the support frame 1A of hollow structure in the present embodiment as shown in FIG. 4A, a support frame made of aluminum alloy may be shaped using a device such as a 3D printer that enables modeling of an object by means of an additive fabrication method. This configuration allows the frame body of the support frame to be made up as one member.

Figure 7A:
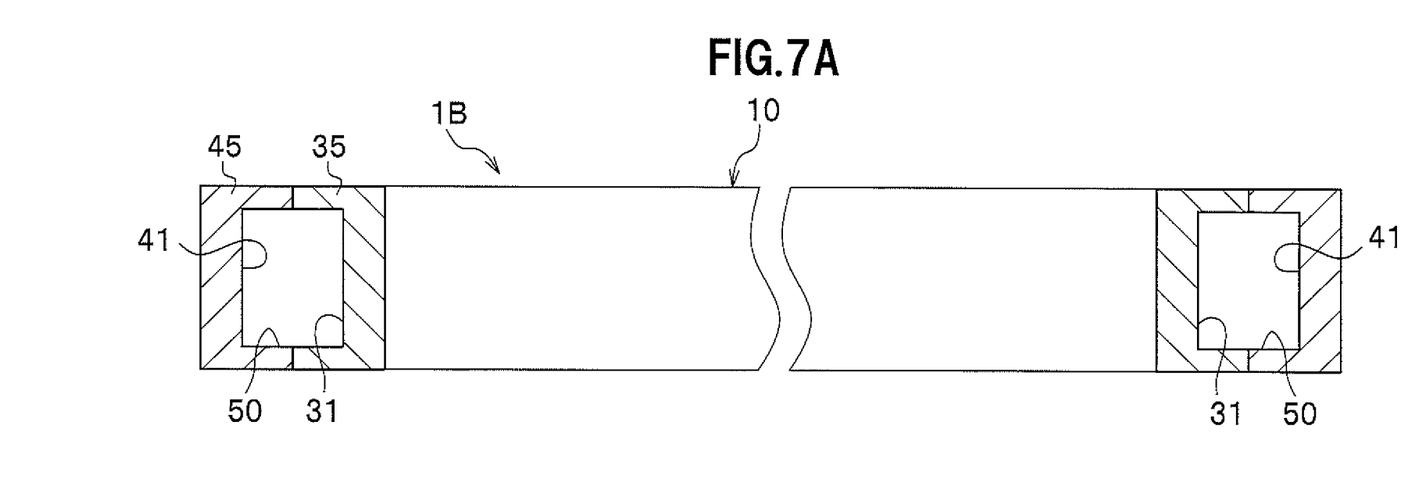
FIG. 7A is a sectional side view of a configuration having inner and outer frame members.

Although the frame members 30, 40 at the upper and lower sides are bonded together in the present embodiment, a support frame 1B shown in FIG. 7A may be adopted in which an inner frame member 35 is disposed inside an outer frame member 45 and an outer peripheral surface of the inner frame member 35 and an inner peripheral surface of the outer frame member 45 are bonded to each other. This configuration forms a structure that allows bonded portions to be not exposed on the inner peripheral surface and the outer peripheral surface of the support frame 1B.

Moreover, in the support frame 1B, the groove 31 is formed on the outer peripheral surface of the inner frame member 35 and the groove 41 is formed on the inner peripheral surface of the outer frame member 45, and the grooves 31, 41 of the inner and outer frame members 35, 45 form a hollow portion 50.

Figure 7B:
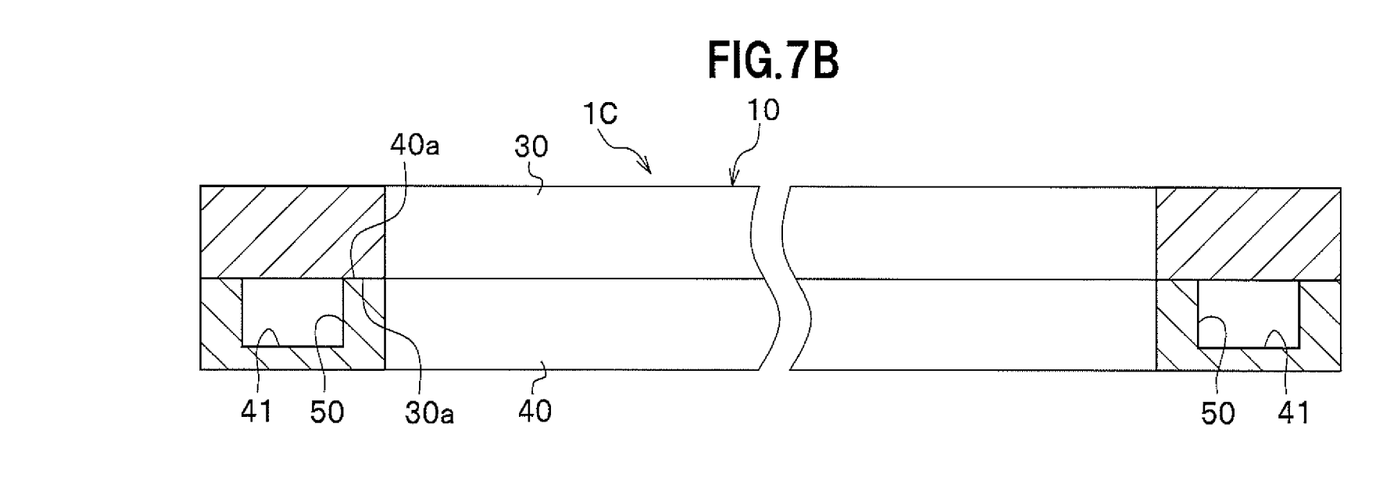
FIG. 7B is a sectional side view of a configuration having a groove formed only on a frame member at the lower side.

Although the grooves 31, 41 are formed on both of the two frame members 30, 40 in the present embodiment as shown in FIG. 2, a support frame 1C shown in FIG. 7B may be adopted in which the groove 41 is formed only on the upper surface 40a of the frame member 40 at the lower side.

This configuration allows the groove 41 of the frame member 40 at the lower side to be blocked by the frame member 30 at the upper side, thereby forming the hollow portion 50.

Note that a structure may be adopted in which a groove is formed only on the lower surface 30a of the frame member 30 at the upper side and the groove of the frame member 30 at the upper side is blocked by the frame member 40 at the lower side to form the hollow portion 50.

Although the plurality of hollow portions 51 to 53 are formed in the frame body 10 in the present embodiment as shown in FIG. 3, the number and location thereof are not limited to the embodiment. For example, bended hollow portions may be formed at corners of the frame body 10.

Also, although the axial cross-section of each of the hollow portions 51 to 53 (see FIG. 3) is formed into a rectangular shape in the present embodiment as shown in FIG. 4B, the shape thereof is not limited to the embodiment.

Moreover, although the axial cross-section of the frame member 30 at the upper side and the axial cross-section of the frame member 40 at the lower side are formed into the same shape in the present embodiment as shown in FIG. 4B, heights of the axial cross-sections of both of the frame members 30, 40 may differ from each other.

Furthermore, although the axial cross-section of the frame body 10 is formed into a rectangular shape in the present embodiment, the shape thereof is not limited to the embodiment. For example, the axial cross-section of the frame body 10 may be formed into a square shape.

REFERENCE SIGNS LIST

1A Support frame
2 Pellicle film
4a Adhesive layer
4b Pressure-sensitive adhesive layer
5 Flat plate
10 Frame body
11 Crosswise frame portion
12 Lengthwise frame portion
20 Through-hole
30 Frame member on upper side
30a Lower surface
31 Groove
40 Frame member on lower side
40a Upper surface
41 Groove
51 First hollow portion
52 Second hollow portion
53 Third hollow portion
60 Hole for jig
M Transparent substrate
P Pellicle

The invention claimed is:

1. A pellicle support frame comprising:
a frame body made of aluminum alloy and adapted to allow a pellicle film to be bonded to an upper surface thereof and to allow a transparent substrate to be bonded to a lower surface thereof, wherein the frame body consists of two frame members bonded together at their bonding surfaces, each of the two frame members being composed of one member having an outer rectangular shape in the planar direction;
a plurality of hollow portions provided within the frame body arranged in a circumferential direction of the frame body, and the hollow portions are not communicated with an external space;
a through-hole formed between two adjacent hollow portions of the plurality of hollow portions, the through-hole leading from an outer peripheral surface to an inner peripheral surface of the frame body; and
a plurality of grooves provided to be arranged in the circumferential direction on at least one of bonding surfaces of the two frame members, the bonding surfaces lying in a direction along the circumferential direction of the two frame members and the grooves forming the hollow portions.

2. The pellicle support frame according to claim 1, wherein the bonding surfaces of the two frame members are bonded directly to each other.

3. The pellicle support frame according to claim 2, wherein the bonding surfaces of the two frame members are bonded by at least one of diffusion bonding and vapor deposition using a focused ion beam.

4. The pellicle support frame according to claim 2, wherein the two frame members have the same shape and both of the frame members are oppositely disposed in the upper-lower direction.

5. The pellicle support frame according to claim 1, further comprising:
a plurality of cylindrical holes each having a bottom formed in the outer peripheral surface of the frame body.

6. The pellicle support frame according to claim 1, wherein the inner peripheral wall and the outer peripheral wall of at least one hollow portion of the frame body are thicker than the upper and lower walls of the at least one hollow portion.

7. The pellicle support frame according to claim 1, wherein at least one of the plurality of hollow portions is longer in the circumferential direction than at least one other of the plurality of hollow portions.

8. A production method for a pellicle support frame consisting of two frame members made of aluminum alloy and each having an outer rectangular shape in the planar direction, comprising:
a step of forming a plurality of grooves on at least one of the bonding surfaces of the two frame members, the bonding surfaces lying in a direction along a circumferential direction of the two frame members; and
a step of bonding the bonding surfaces of the two frame members, each frame member being composed of one member, wherein each of the plurality of grooves of the two bonded frame members forms a hollow rectangular shaped portion that is not communicated with an external space.

9. The production method for the pellicle support frame, according to claim 8, wherein the two frame members are subjected to solid-phase bonding.

10. The production method for the pellicle support frame, according to claim 8, wherein
the step of bonding the bonding surfaces of the two frame members to each other includes bonding the bonding surfaces of the two frame members directly to each other.

11. The production method for the pellicle support frame, according to claim 10, wherein the step of bonding the bonding surfaces of the two frame members to each other includes at least one of diffusion bonding and vapor deposition using a focused ion beam.

* * * * *